(12) United States Patent
Fujiwara

(10) Patent No.: US 6,225,844 B1
(45) Date of Patent: May 1, 2001

(54) OUTPUT BUFFER CIRCUIT THAT CAN BE STABLY OPERATED AT LOW SLEW RATE

(75) Inventor: Tsukasa Fujiwara, Kanagawa (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/291,321

(22) Filed: Apr. 15, 1999

(30) Foreign Application Priority Data

Apr. 20, 1998 (JP) .................................................. 10-109677

(51) Int. Cl.$^7$ ...................................................... H03K 5/12
(52) U.S. Cl. .......................... 327/170; 327/108; 327/112; 327/437
(58) Field of Search ............................ 327/108–112, 170, 327/374, 376, 377, 436, 437; 326/56–58, 81, 83, 85, 87

(56) References Cited

U.S. PATENT DOCUMENTS

| 4,731,553 | * | 3/1988 | Van Lehn et al. | 326/58 |
| 5,081,374 | * | 1/1992 | Davis | 326/58 |
| 5,422,523 | * | 6/1995 | Roberts et al. | 326/81 |
| 5,977,790 | * | 11/1999 | Sanwo et al. | 326/83 |

FOREIGN PATENT DOCUMENTS

| 1-171317 | 7/1989 | (JP) . |
| 4-172012 | 6/1992 | (JP) . |
| 5-191259 | 7/1993 | (JP) . |
| 5-347545 | 12/1993 | (JP) . |
| 5-114852 | 9/1994 | (JP) . |
| 6-252723 | 9/1994 | (JP) . |
| 8-56147 | 2/1996 | (JP) . |

* cited by examiner

Primary Examiner—Kenneth B. Wells
(74) Attorney, Agent, or Firm—McGinn & Gibb, PLLC

(57) ABSTRACT

An output buffer circuit includes first and second buffers, a slew rate control section and a first resistor. The first buffer has a pull-up transistor and a pull-down transistor to output an output signal to an output section from a first node located between the pull-up and pull-down transistors. The second buffer has complementary transistors and is provided in a front portion of the first buffer. A second node is located between the complementary transistors to be connected to the first node. The first resistor is connected between the second node and the output section to function as an output resistor of the second buffer. The first buffer complementarily operates in response to first and second control resistor respectively inputted to control electrodes of the pull-up and pull-down transistors, to output the output signal to the output section. The slew rate control section generates the first and second control resistor from an input signal such that the first and second control resistor have slew rates respectively adjusted.

8 Claims, 10 Drawing Sheets

US 6,225,844 B1

OUTPUT BUFFER CIRCUIT THAT CAN BE STABLY OPERATED AT LOW SLEW RATE

BACKGROUND OF THE INVENTION

1. Field of the Invention

The present invention relates to an output buffer circuit. More particularly, the present invention relates to a slew rate buffer type of an output buffer circuit having a function of controlling a slew rate of an output signal.

2. Description of the Related Art

In general, an output buffer circuit having this type of slew rate control function is used for an output in a signal system, in which a speed is slow, such as a reset signal, a stop signal, a standby signal. The slew rate control function enables the stable operation in which a load circuit receiving the output signal does not suffer from the influence, such as high harmonic noise, ringing.

A conventional type of output buffer circuit is, for example, disclosed in Japanese Laid Open Patent Application (JP-A-Heisei 8-56147) ('147), Japanese Laid Open Patent Application (JP-A-Heisei 4-172012) ('012), Japanese Laid Open Patent Application (JP-A-Heisei 5-191259) ('259), Japanese Laid Open Patent Application (JP-A-Heisei 1-171317) ('317), Japanese Laid Open Patent Application (JP-A-Heisei 5-347545) ('545), Japanese Laid Open Patent Application (JP-A-Heisei 5-114852) ('852) and Japanese Laid Open Patent Application (JP-A-Heisei 6-252723) ('723).

The conventional first output buffer circuit disclosed in the '147 publication will be described below with reference to FIG. 1. The conventional first output buffer circuit is provided with inverters IV1, IV2, a P-channel MOS transistor P1, an N-channel MOS transistor N1, a bias circuit 103, a P-channel MOS transistor P2, an N-channel MOS transistor N2, a bias circuit 104, a slew rate control circuit 101, a slew rate control circuit 102, an output buffer 2, a schmitt trigger ST1 and a schmitt trigger ST2.

The inverters IV1, IV2 are connected in series, and then receive an input signal IN, and further output signals IB, IBB, respectively. In the P-channel MOS transistor P1, a source thereof is connected to a power supply VDD, and a gate thereof is connected to the output of the inverter IV1, respectively. In the N-channel MOS transistor N1, a source thereof is connected to a ground G, and a gate thereof is connected to an output of the schmitt trigger ST1, respectively. The bias circuit 103 is inserted between respective drains of the transistors P1, N1, and then outputs bias voltages B1, B1B.

In the P-channel MOS transistor P2, a source thereof is connected to the power supply VDD, and a gate thereof is connected to an output of the schmitt trigger ST2, respectively. In the N-channel MOS transistor N2, a source thereof is connected to the ground G, and a gate thereof is connected to the output of the inverter IV1, respectively. The bias circuit 104 is inserted between respective drains of the transistors P2, N2, and then outputs bias voltages B2, B2B.

The slew rate control circuit 101 receives the output signal IBB of the inverter IV2 and the bias voltages B1, B1B, and then outputs a slew rate control signal T1. The slew rate control circuit 102 receives the output signal IBB of the inverter IV2 and the bias voltages B2, B2B, and then outputs a slew rate control signal T2. An output buffer 2 outputs an output signal O to an output terminal TO, in response to the supply of the signals T1, T2. The schmitt trigger ST1 sends an output signal S1 to the gate of the transistor N1, in response to the supply of the signal T1. The schmitt trigger ST2 sends an output signal S2 to the gate of the transistor P2, in response to the supply of the signal T2.

The output buffer 2 is provided with a P-channel MOS transistor P21 that is a pull-up transistor and an N-channel MOS transistor N21 that is a pull-down transistor. In the P-channel MOS transistor P21, a source thereof is connected to the power supply VDD, and a drain thereof is connected to the output terminal TO, respectively, and the gate receives the signal T1. In the N-channel MOS transistor N21, a drain thereof is connected to the drain of the transistor P21, and a source thereof is connected to the ground G, respectively, and the gate receives the signal T2.

The slew rate control circuit 101 is provided with a P-channel MOS transistor P101, an N-channel MOS transistor N101, a P-channel MOS transistor P102 and a capacitor C101.

In the P-channel MOS transistor P101, a source thereof is connected to the power supply VDD, and then a gate thereof receives the signal B1, and a drain thereof outputs the signal T1. In the N-channel MOS transistor N101, a drain thereof is connected to the drain of the transistor P101, and a source thereof is connected to the ground G, respectively, and then a gate thereof receives the signal B1B. In the P-channel MOS transistor P102, a gate thereof is connected to the output of the inverter IV2, a source thereof is connected to the power supply VDD, and a drain thereof is connected to the drain of the transistor P101, respectively. The capacitor C101 is connected between the drain of the transistor P102 and the ground G, and then generates a gate capacitance of the transistor P21 in the output buffer circuit 2.

The slew rate control circuit 102 is provided with a P-channel MOS transistor P103, an N-channel MOS transistor N102, an N-channel MOS transistor N103 and a capacitor C102.

In the P-channel MOS transistor P103, a source thereof is connected to the power supply VDD, and then a gate thereof receives the signal B2, and a drain thereof outputs the signal T2.

In the N-channel MOS transistor N102, a drain thereof is connected to the drain of the transistor P103, and a source thereof is connected to the ground G, respectively, and then a gate thereof receives the signal B2B. In the N-channel MOS transistor N103, a gate thereof is connected to the output of the inverter IV2, a source thereof is connected to the ground G, and a drain thereof is connected to the drain of the transistor P103, respectively. The capacitor C102 is connected between the drain of the transistor N102 and the ground G, and then generates a gate capacitance of the transistor N21 in the output buffer circuit 2.

The operations of the conventional first output buffer circuit will be described below with reference to FIG. 2.

At first, suppose that the operations start from a stable state in which the input signal IN and the output signal O are in an L level, that is '0'. At this time, the transistor P21 of the output buffer 2 is in an off-state, and the transistor N21 is in an on-state. This indicates that the signals T1, T2 are '1'.

In accordance with an H level of the signal T2, the input to the schmitt trigger ST2 is also '1', and then the output signal S2 of the schmitt trigger ST2 is '1', and further the transistor P2 is in the off-state.

Moreover, since the input signal IN is '0', the signal IB is '1', and then the signal IBB is '0', and thereby the transistor N103 is in the off-state, and the transistor N2 is in the on-state. Accordingly, the bias circuit 104 becomes inactive, and the bias voltages B2, B2B are equal to a potential of the ground G. Thus, the transistor N102 is in the off-state, and the transistor P103 becomes in a linear area and functions as a resistor. Hence, the signal T2 corresponds to a potential of a condition that it is connected through a resistive clamp to the power supply VDD.

Similarly, if the signal T1 is '1', the input to the schmitt trigger ST1 is '1', and then the output signal S1 of the schmitt trigger ST1 is '1', and further the transistor N1 is in the on-state. Moreover, since the input signal IN is '0', the transistor P1 is in the off-state, and also the transistor P102 is in the on-state. The bias circuit 103 is inactive, and the bias voltages B1, B1B are equal to the potential of the ground G. Accordingly, the transistor N101 is in the off-state, and the transistor P101 becomes in the linear area, and then functions as the resistor. Thus, the signal T1 corresponds to a potential of a condition that it is connected through both the transistor P102 and the transistor P101 to the power supply VDD. The signal T1 corresponds to a potential of a condition that it is connected through a resistive clamp to the power supply VDD.

At first, at a leading edge of the input signal IN, the transistor N103 rapidly discharges a gate capacitance C102 of the pull-down transistor N21, and rapidly turns off this transistor N21. Then, when the signal IB becomes in the L level, the transistor N2 is turned off and meanwhile the potential of the signal T2 becomes equal to or less than a threshold of the schmitt trigger ST2, the transistor P2 is turned on. Although the bias circuit 104 is still inactive, the bias voltages B2, B2B at this time are equal to a value of a voltage of the power supply VDD. Thus, the transistor P103 is turned off, and thereby the transistor N102 is biased in a straight area.

Next, when the signal IB is shifted from '1' to '0', the transistor P1 is turned on. Since the transistor N1 is in the on-state, the bias circuit 103 is operated. Similarly, the transistor N103 is turned on, and also the transistor P102 is turned on. The bias voltages B1, B1B are in a saturation area, and the transistors P101, N101 are biased therein. Thus, these transistors P101, N101 substantially function as a constant current source and a constant current sink, respectively. A gate capacitance C101 of the transistor P21 is discharged under a substantially constant bias (discharging) current Ib1 which is a difference between respective drain currents of the transistors N101, P101.

When the voltage of the signal T1 becomes equal to or less than about ⅓ times the voltage of the power supply VDD, the state of the schmitt trigger ST1 is shifted, and the transistor N1 is turned off. Thus, the bias circuit 103 is inactive, and the bias voltages B1, B1B are equal to the value of the voltage of the power supply VDD. Accordingly, the transistor P101 is turned off, and the transistor N101 is biased in the straight area. That is, the transistor P101 is gradually changed to the value of the voltage of the ground G from a substantially constant current sink with respect to the resistive clamp. The bias current Ib1 is gradually reduced to 0.

As mentioned above, the bias current Ib1 is substantially constant in a period while the transistor N101 is operated as the substantially constant current sink. Thus, the voltage VT1 of the signal T1 is dropped substantially straight in accordance with a slew rate VSR=dVT1/dt=Ib1/C101. That is, the slew rate VSR of the gate voltage of the transistor P21 is represented by the equation:

$$VSR=VDD/\{a\times(Imax/ISR)\}$$

Here, the ISR is a slew rate of the drain current of the transistor P21. The Imax is a peak value of the drain current of the transistor P21 obtained when the voltage VT1-VDD between the gate and the source of the transistor P21 and the voltage O-VDD between the drain and the source of the transistor P21 are both equal to the voltage VDD. The a is an experimental constant ranging between 1.2 and 1.3 with respect to a sub-micron CMOS process.

Hence, the ISR is represented by the equation:

$$ISR=Ib1\times(Imax/C101)\times(a/VDD)$$

It is possible to properly select the discharging current Ib1 to thereby achieve the control of the slew rate ISR of the drain current of the pull-up transistor P21.

Next, at a trailing edge of the input signal IN, the transistor P102 rapidly charges the gate capacitance C101 of the pull-up transistor P21, and rapidly turns off the transistor P21. From this time, the operations similar to the above-mentioned operations except an inversion of a polarity enable the control of the slew rate of the drain current of the pull-down transistor N21.

However, although this conventional first output buffer circuit is effective for a circuit in which the slew rate is relatively fast (approximately several tens nano-seconds), this has a problem that it is difficult to apply to a circuit in which the slew rate is slow (approximately several nano-seconds).

There are two methods described below, as a manner to use the conventional first output buffer circuit to thereby attain a circuit in which the slew rate is slow. For explanatory convenience, as a condition, it is assumed that the bias currents Ib1, Ib2 of the slew rate control circuits 101, 102 are constant.

That is, a first method (1) is a method of making the transistor sizes of the transistors P21, N21 in the output buffer 2 constant and thereby increasing the capacitances of the respective capacitors C101, C102 in the slew rate control circuits 101, 102. A second method (2) is a method of making the capacitances of the respective capacitors C101, C102 in the slew rate control circuits 101, 102 constant and thereby decreasing the transistor sizes of the transistors P21, N21 in the output buffer 2.

However, the first method (1) has a problem that the increase of the capacitances of the capacitors C101, C102 causes a layout area to be extremely larger. Referring to FIG. 2 showing in a time chart the change of a delay time tpd if the transistor size is changed, as the transistor size is decreased in order of A→B→C, the delay time tpd becomes larger in the second method (2). Moreover, a performance of driving the output current (the output signal O) to the output terminal TO is naturally reduced in conjunction with the decrease of the transistor sizes of the transistors P21, N21.

The conventional second output buffer circuit disclosed in the document 2 will be described below with reference to FIG. 3. In FIG. 3, common reference characters/numerals are given to the elements common to those of FIG. 1.

The conventional second output buffer circuit is provided with an output buffer 2, an inverter IV1, a first stage buffer 1, a gate potential control circuit 202, a gate potential control circuit 203 and a delay buffer 204.

The output buffer 2 and the inverter IV1 are respectively common to those of the conventional first output buffer circuit. The first stage buffer 1 is composed of a P-channel MOS transistor P11 and an N-channel MOS transistor N11. A current supply performance thereof is smaller than that of the output buffer 2. The gate potential control circuit 202 controls a gate potential of a pull-up transistor P21 of the output buffer 2, in accordance with an input level IN. The gate potential control circuit 203 controls a gate potential of a pull-down transistor N21 of the output buffer 2, in accordance with the input level IN.

The operations of the conventional second output buffer circuit will be described below.

When the input level IN is a level of the ground G, a signal IB is in the H level. Thus, N-channel MOS transistors N202, N204 of the gate potential control circuits 202, 203 are in the on-state, and P-channel MOS transistors P202, P204 are in the off-state. Hence, a signal G1 is in the ground G level equal to a potential of the input signal IN, and a signal G2 is in the ground G level equal to a potential of an output signal O. Signals T, T2 become both in the H level. Accordingly, the transistor P21 is in the off-state, and the transistor N21 is in the on-state.

Next, when the input signal IN rises up on a side of the H level, the transistors N202, N204 become in the off-state, and the transistor P204 becomes in the on-state. At this time, the transistor P202 is in the off-state until the level of the output signal O becomes higher than the signal G1 by a threshold voltage VT of the transistor P202. The potential of the signal G1 is kept in the potential of the ground G, until the delay buffer 204 switches the first stage buffer 1. Similarly, the signal T1 is located on the side of the high potential, and the transistor P21 is also in the off-state.

The potential of the signal G2 is shifted to the side of the H level, and the signal T2 becomes in the L level. Thus, the transistor N21 is turned off. At this time, the output of the buffer 204 is shifted from the side of the H level to the side of the L level. The transistors P21, N21 of the output buffer 2 are both in the off-state until the first stage buffer 1 is switched.

When the output of the buffer 204 is shifted from the H level to the L level and the first stage buffer 1 is switched, the transistor P11 is shifted from the off-state to the on-state, and the transistor N11 is shifted from the on-state to the off-state, respectively. Then, the output signal O is shifted from the ground potential G level to the H level. At this time, the current supply performances of the transistors P11, N11 are small. Hence, a penetrating current is small, and the generation of power supply noise is also small.

Next when the potential of the output signal O becomes higher than that of the signal G1 by a value of a threshold voltage of the transistor P202, the transistor P202 is turned on. When the level of the signal G1 reaches a threshold of an inverter provided with the transistors P203, N203, the signal T1 is shifted from the H level to the level of the ground G, and the transistor P21 becomes in the on-state. The current supply performance at this time is a value equal to the sum of the transistors P21 and P11.

When the input signal IN is dropped from the H level to the ground level G, the transistor P21 becomes in the off-state. When the first stage buffer 1 is switched, the potential of the output signal O is shifted from the H level to the ground level G by the transistor N11. When the potential of the output signal O reaches a threshold of an inverter provided with the transistors P205, N205, the signal T2 is shifted from the L level to the H level, and the transistor N21 becomes in the on-state.

The conventional third output buffer circuit disclosed in the 259 publication will be described below with reference to FIG. 4. In FIG. 4, common reference characters/numerals are given to the elements common to that of FIG. 3.

As shown in FIG. 4, the conventional third output buffer circuit is provided with a first stage buffer 1, an output buffer 2, an inverter IV1, an supplementary drive circuit 301 and a supplementary drive circuit 302. The first stage buffer 1, the output buffer 2 and the inverter IV1 are respectively common to those of the conventional second output buffer circuit.

The supplementary drive circuit 301 switches a gate signal of a transistor P21 to any one of the L level and the delay signal when an input signal is shifted, under the control of a control signal M1. The supplementary drive circuit 302 switches a gate signal of a transistor N21 to any one of the H level and the delay signal when the input signal is shifted, under the control of a control signal M2. The supplementary drive circuit 301 and the supplementary drive circuit 302 are provided instead of the gate potential control circuits 202, 203 of the conventional second output buffer circuit.

This conventional third output buffer circuit is operated such that instead of the gate potential control circuits 202, 203, the supplementary drive circuits 301, 302 relax the transient phenomenon occurring at the time of the level shift in the input signal IN, and the power supply noise occurring at the time of the level shift in the output is suppressed in the case of the large current drive.

The conventional fourth output buffer circuit disclosed in the 317 publication will be described below with reference to FIG. 5. In FIG. 5, common reference characters/numerals are given to the elements common to that of FIG. 3.

The conventional fourth output buffer circuit is provided with an exclusive-OR circuit 401, in addition to the first stage buffer 1, the output buffer 2 and the delay buffer 204 which are common to those of the conventional second output buffer circuit.

The exclusive-OR circuit 401 carries out an exclusive-OR operation of the output signal of the delay buffer 204 and the input signal IN, and then generates an inversion input signal T1 of the output buffer 2. The operations, especially, the operations of the first stage buffer and the output buffer are substantially identical to those of the conventional second and third output buffer circuits. Thus, the explanations thereof are omitted.

However, if the conventional second, third and fourth output buffer circuits try to attain the characteristic of the low slew rate targeted by the present invention, this results in a problem that the dispersions of the on-resistances of the transistors and the like cause the dispersion of the slew rate to be larger.

For example, when considering the first stage buffer 1 as an example, it is necessary to set the respective on-resistances of the P-channel MOS transistor P11 and the N-channel MOS transistor N11 constituting this first stage buffer 1 to be larger, in order to make the slew rate slower, that is, lower.

On the other hand, as the on-resistance is higher, it receives the influences of the dispersions of a voltage of a power supply, a temperature, a manufacturing process and the like. It causes the dispersion of approximately 50% with respect to a central value, as an example. This dispersion is directly reflected as the dispersion of the slew rate. Moreover, in all the cases of the conventional second, third and fourth output buffer circuits, the output terminal of the first stage buffer 1 is directly connected to the output terminal of the output buffer 2 in parallel. Thus, the dispersion of the slew rate in the first stage buffer 1 is directly reflected in the dispersion of the slew rate of the output signal O.

The conventional first output buffer circuit is essentially the buffer circuit for the fast operation. Thus, in order to achieve the circuit having the low slew rate, it is necessary to employ any one of the method of making the gate capacitances of the respective transistors in the output buffer larger and the method of making the sizes of the respective transistors in the output buffer smaller to thereby make the driving performance lower. The former case causes the area occupied by the capacitor for the gate capacitance addition to be increased. The latter case causes the delay time to be longer, and also causes the load current driving performance to be smaller. This results in a defect that it is difficult to attain the circuit having the low slew rate.

If the conventional second, third and fourth output buffer circuits try to achieve the performance of the low slew rate, it is necessary to set the on-resistances of the transistors constituting the buffer circuit to be higher. Thus, it easily receives the influences of the dispersions of the voltage of the power supply, the temperature and the manufacturing process. This leads to a defect that the dispersion of the slew rate is larger. Moreover, the respective output terminals of the first stage buffer 1 and the output buffer 2 are directly connected parallel to each other, which results in a defect that the dispersion of the slew rate in the first stage buffer 1 is directly reflected as the dispersion of the slew rate in the output signal.

The following configuration is disclosed in an output buffer of a semiconductor integrated circuit noted in the 545 publication. That is, a P-channel MOS transistor P11 at a final stage of the output buffer is connected to a supplementary P-channel MOS transistor P12 in parallel to each other. An N-channel MOS transistor N11 is connected to a supplementary N-channel MOS transistor N12 in parallel to each other. Then, supplementary control circuits G12, G13 each composed of NAND gates or NOR gates and a delay circuit for controlling these supplementary MOS transistors are provided therein.

The following configuration is disclosed in a small noise output drive circuit noted in the 852 publication. That is, it includes a first drive circuit having on a power supply side a MOSFET for reducing a value corresponding to a threshold voltage in which a gate and a drain are connected to each other, and a second drive circuit having a typical structure composed of CMOS inverters. The operation is controlled by a delay control circuit so that the first drive circuit is firstly driven and the second drive circuit is next driven. According to this configuration, in the first drive circuit, a voltage drop corresponding to the threshold voltage leaves therein, and accordingly it does not shake up to a potential of the power supply. After it reaches the potential of the power supply in the second drive circuit. This method can suppress an excessive transient current when the output is changed. Moreover, this method can solve an overshoot and an undershoot.

The following configuration is disclosed in a load drive circuit noted in the 723 publication. That is, it includes a control device which in the load drive circuit for connecting a load to a power supply in an output section of a CMOS circuit, when mutually turning on and off a P-channel MOS transistor and an N-channel transistor constituting the CMOS circuit, turns off both the transistors for a predetermined period.

SUMMARY OF THE INVENTION

The present invention has been made to solve the above-described problems of the conventional output buffer circuit. The object of the present invention is to provide an output buffer circuit which can be stably operated at a low slew rate. The object of the present invention is to provide an output buffer circuit which can be stably operated at a low slew rate without suffering from the influences of high harmonic noise in a load circuit, ringing and the like.

In order to achieve an aspect of the present invention, an output buffer circuit includes a first buffer having a pull-up transistor and a pull-down transistor to output an output signal to an output section from a first node located between the pull-up transistor and the pull-down transistor, a second buffer having complementary transistors and provided in a front portion of the first buffer, wherein a second node located between the complementary transistors is connected to the first node, a slew rate control section and a first resistor connected between the second node and the output section to function as an output resistor of the second buffer, wherein the first buffer complementarily operates in response to first and second control signals respectively inputted to control electrodes of the pull-up transistor and the pull-down transistor, to output the output signal to the output section, and wherein the slew rate control section generates the first and second control signals from an input signal such that the first and second control signals have slew rates respectively adjusted.

In this case, an on-resistance of the second buffer is equal to or less than $\frac{1}{10}$ times a resistance of the first resistor.

Also in this case, the output signal changes increasingly such that the output signal has first and second change rates, and the output signal changes decreasingly such that the output signal has third and fourth change rates, and the output signal corresponding to the first and third change rates is controlled by the second buffer and the first resistor and the output signal corresponding to the second and fourth change rates is controlled by the first buffer controlled based on the first and second control signals.

Further in this case, the output buffer circuit, further includes a load capacitance connected to the output section and wherein the output signal has a characteristic curve section corresponding to a time constant obtained by the first resistor and the load capacitance and a curve section corresponding to a charging/discharging operation of the load capacitance by the first buffer.

In order to achieve another aspect of the present invention, an output buffer circuit includes a first buffer having a first P-channel transistor and a first N-channel transistor; a second buffer having a second P-channel transistor and a second N-channel transistor; a slew rate control section; and a first resistor, and wherein a first electrode of the first P-channel transistor is connected to a first power supply, and a second electrode of the first P-channel transistor is connected to an output section, wherein a first electrode of the first N-channel transistor is connected to a second power supply, and a second electrode of the first N-channel transistor is connected to the output section, wherein the first P-channel transistor and the first N-channel transistor complementarily operates in response to first and second control signals respectively inputted to control electrodes of the first P-channel transistor and the first N-channel transistor to output an output signal to the output section, wherein a first electrode of the second P-channel transistor is connected to a third power supply, a second electrode of the second P-channel transistor is connected to an output node, and a drive signal corresponding to an input signal is inputted to a control electrode of the second P-channel transistor, wherein a first electrode of the second N-channel transistor is connected to a fourth power supply, a second electrode of the second N-channel transistor is connected to the output node, and a control electrode of the second N-channel transistor is connected to the control electrode of the second P-channel transistor, wherein the slew rate control section generates the first and second control signals from the input signal such that the first and second control signals have slew rates respectively adjusted, and wherein the first resistor is connected between the output node and the output section to function as an output resistor of the second buffer.

In this case, the slew rate control section includes a first control signal generating section for receiving the input signal to output the first control signal from a third node; and a second control signal generating section for receiving the input signal to output the second control signal from a fourth node, and wherein the first control signal generating section includes a third P-channel transistor for receiving the input signal in a control electrode of the third P-channel transistor, a first electrode of the third P-channel transistor being connected to a fifth power supply; a first control element for determining a change rate when the first control signal is changed, one terminal of the first control element being connected to a second electrode of the third P-channel transistor at the third node; a third N-channel transistor, a first electrode of the third N-channel transistor being connected to a sixth power supply and a second electrode of the third N-channel transistor being connected to another terminal of the first control element; and a first capacitor, one end of the first capacitor being connected to the third node and the other end of the first capacitor being connected to a seventh power supply, and wherein the second control signal generating section includes: a fourth P-channel transistor for receiving the input signal in a control electrode of the fourth P-channel transistor, a first electrode of the fourth P-channel transistor being connected to a eighth power supply; a second control element for determining a change rate when the second control signal is changed, one terminal of the second control element being connected to a second electrode of the fourth P-channel transistor a fourth N-channel transistor, a first electrode of the fourth N-channel transistor being connected to a ninth power supply and a second electrode of the fourth N-channel transistor being connected to another terminal of the second control element at the fourth node; and a second capacitor, one end of the second capacitor being connected to the fourth node and the other end of the second capacitor being connected to a tenth power supply.

Also in this case, the first control element is a resistor.

Further in this case, the second control element is a resistor.

In this case, the first control element is a resistor to determine a change rate when the first control signal is changed, based on a characteristic of charging/discharging of the first capacitor determined by a time constant obtained between the first capacitor and the first control element.

Also in this case, the second control element is a resistor to determine a change rate when the second control signal is changed, based on a characteristic of charging/discharging of the second capacitor determined by a time constant obtained between the second capacitor and the second control element.

Further in this case, the first control element is a control N-channel transistor, a first bias voltage being supplied to a control electrode of the control N-channel transistor, a second electrode of the control N-channel transistor being connected to the second electrode of the third P-channel transistor as the one terminal, and a first electrode of the control N-channel transistor being connected to the second electrode of the third N-channel transistor as the another terminal.

In this case, the second control element is a control P-channel transistor, a second bias voltage being supplied to a control electrode of the control P-channel transistor, a second electrode of the control P-channel transistor being connected to the second electrode of the fourth N-channel transistor as the another terminal, and a first electrode of the control P-channel transistor being connected to the second electrode of the third P-channel transistor as the one terminal.

Also in this case, the control N-channel transistor determines a change rate when the first control signal is changed based on the first bias voltage due to discharging of the first capacitor based on the first bias voltage, the first bias voltage being inputted to the control electrode of the control N-channel transistor.

Further in this case, the control P-channel transistor determines a change rate when the second control signal is changed based on the second bias voltage due to charging of the second capacitor based on the second bias voltage, the second bias voltage being inputted to the control electrode of the control P-channel transistor.

In this case, the slew rate control section includes third, fourth and fifth P-channel transistors; third, fourth and fifth N-channel transistors; and first and second capacitors, and wherein a first electrode of the third P-channel transistor is connected to a fifth power supply, a control electrode of the third P-channel transistor receives the input signal, and a second electrode of the third P-channel transistor outputs the first control signal, wherein a second electrode of the third N-channel transistor is connected to the second electrode of the third P-channel transistor, and a first bias voltage is supplied to a control electrode of the third N-channel transistor, wherein a second electrode of the fourth N-channel transistor is connected to the first electrode of the third N-channel transistor, a first electrode of the fourth N-channel transistor is connected to a sixth power supply, and the input signal is inputted to a control electrode of the fourth N-channel transistor, wherein a first electrode of the fourth P-channel transistor is connected to a seventh power supply, and the input signal is inputted to a control electrode of the fourth P-channel transistor, wherein a first electrode of the fifth P-channel transistor is connected to a second electrode of the fourth P-channel transistor, a control electrode of the fifth P-channel transistor receives a second bias voltage, and a second electrode of the fifth P-channel transistor outputs the second control signal, wherein a second electrode of the fifth N-channel transistor is connected to the second electrode of the fifth P-channel transistor, a first electrode of the fifth N-channel transistor is connected to an eighth power supply, and the input signal is inputted to a control electrode of the fifth N-channel transistor, wherein one end of the first capacitor is connected to the second electrode of the third N-channel transistor, and the other end of the first capacitor is connected to a ninth power supply, and wherein one end of the second capacitor is connected to the second electrode of the fifth N-channel transistor, and the other end of the second capacitor is connected to a tenth power supply.

Also in this case, the slew rate control section includes third and fourth P-channel transistors; third and fourth N-channel transistors; first and second capacitors; and second and third resistors, and wherein a first electrode of the third P-channel transistor is connected to a fifth power supply, a control electrode of the third P-channel transistor receives the input signal, and a second electrode of the third P-channel transistor outputs the first control signal, and wherein one end of the second resistor is connected to the second electrode of the third P-channel transistor, and wherein a second electrode of the third N-channel transistor is connected to the other end of the second resistor, a first electrode of the third N-channel transistor is connected to a sixth power supply, and a control electrode of the third N-channel transistor receives the input signal, and wherein a first electrode of the fourth P-channel transistor is connected to a seventh power supply, and a control electrode of the fourth P-channel transistor receives the input signal, and wherein one end of the third resistor is connected to a second electrode of the fourth P-channel transistor, and wherein a second electrode of the fourth N-channel transistor is connected to the other end of the third resistor to output the second control signal, and a first electrode of the fourth N-channel transistor is connected to an eighth power supply, and a control electrode of the fourth N-channel transistor receives the input signal, and wherein one end of the first capacitor is connected to the second electrode of the third P-channel transistor, and the other end of the first capacitor is connected to a ninth power supply, and wherein one end of the second capacitor is connected to the second electrode of the fourth N-channel transistor, and the other end of the second capacitor is connected to a tenth power supply.

Further in this case, the slew rate control section includes a second resistor, one end of the second resistor receiving the input signal; a capacitor, one end of the capacitor being connected to the other end of the second resistor and the other end of the capacitor being connected to a fifth power supply; a first operating section having first and second input sections, wherein the first input section receives the input signal and the second input section is connected to the other end of the second resistor, the first operating section performing a first logical operation on signals inputted respectively from the first and second input sections to output the second control signal from a result of the first logical operation; and a second operating section having first and second input sections, wherein the first input section receives the input signal and the second input section is connected to the other end of the second resistor, the second operating section performing a second logical operation on signals inputted respectively from the first and second input sections to output the first control signal from a result of the second logical operation.

In this case, the slew rate control section includes a first operating section having first and second input sections, wherein the first input section receives the input signal and the second input section receives a clock signal, the first operating section performing a first logical operation on the inputted input signal and clock signal to output the first control signal from a result of the first logical operation; and a second operating section having first and second input sections, wherein the first input section receives the input signal and the second input section receives a clock signal, the second operating section performing a second logical operation on the inputted input signal and clock signal to output the second control signal from a result of the second logical operation.

Also in this case, the slew rate control section includes a comparator circuit having a non-inversion input section and an inversion input section, wherein the non-inversion input section receives the output signal and the inversion input section receives a predetermined voltage signal; a first operating section having first and second input sections, wherein the first input section receives the input signal and the second input section receives an output signal of the comparator circuit, the first operating section performing a first logical operation on the inputted input signal and output signal of the comparator circuit to output the first control signal from a result of the first logical operation; and a second operating section having first and second input sections, wherein the first input section receives the input signal and the second input section receives the output signal of the comparator circuit, the second operating section performing a second logical operation on the inputted input signal and output signal of the comparator circuit to output the second control signal from a result of the second logical operation.

Further in this case, the drive signal is a signal generated by an inversion of the input signal.

BRIEF DESCRIPTION OF THE DRAWINGS

A more complete understanding of the teachings of the present invention may be acquired by referring to the accompanying figures, in which like reference numbers indicate like features and wherein.

DESCRIPTION OF THE PREFERRED EMBODIMENTS

Referring now to drawings, various preferred embodiments according to the present invention will be described in detail. Embodiments of the present invention will be described below with reference to the attached drawings.

Figure 6:
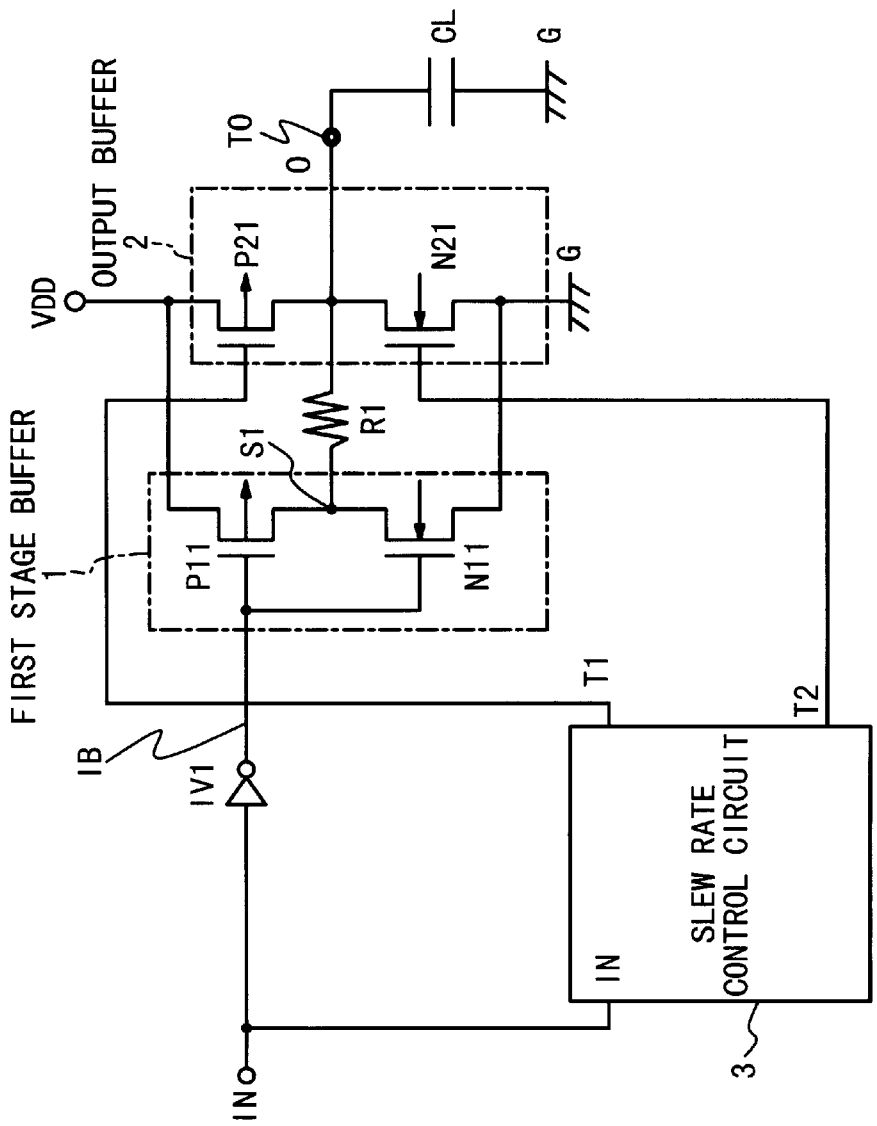
FIG. 6 is a circuit diagram showing a first embodiment of the output buffer circuit in the present invention.

An output buffer circuit of a first embodiment in the present invention will be described below with reference to FIG. 6. In FIG. 6, common reference characters/numerals are given to the elements common to those of FIG. 3.

Figure 1:
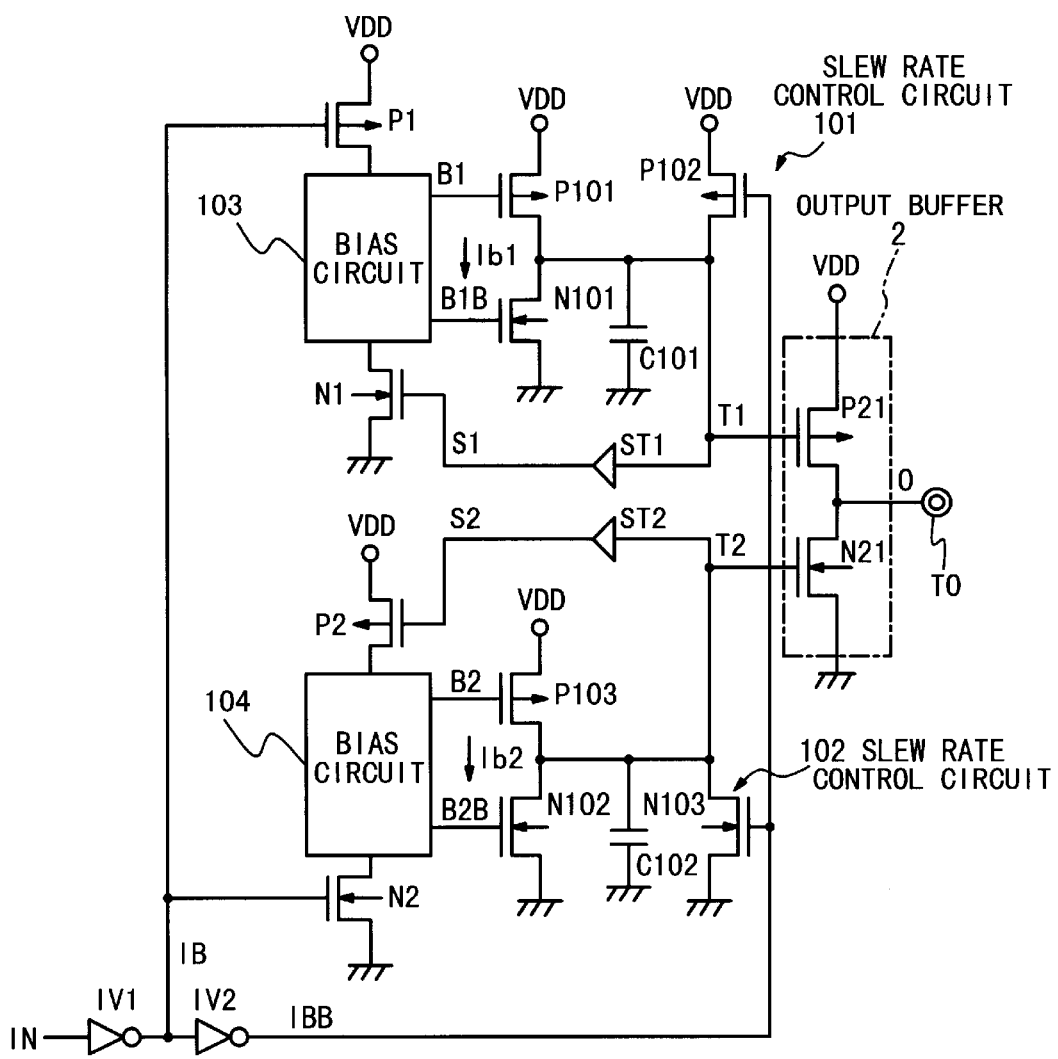
FIG. 1 is a circuit diagram showing an example of a conventional first output buffer circuit.
Figure 2:
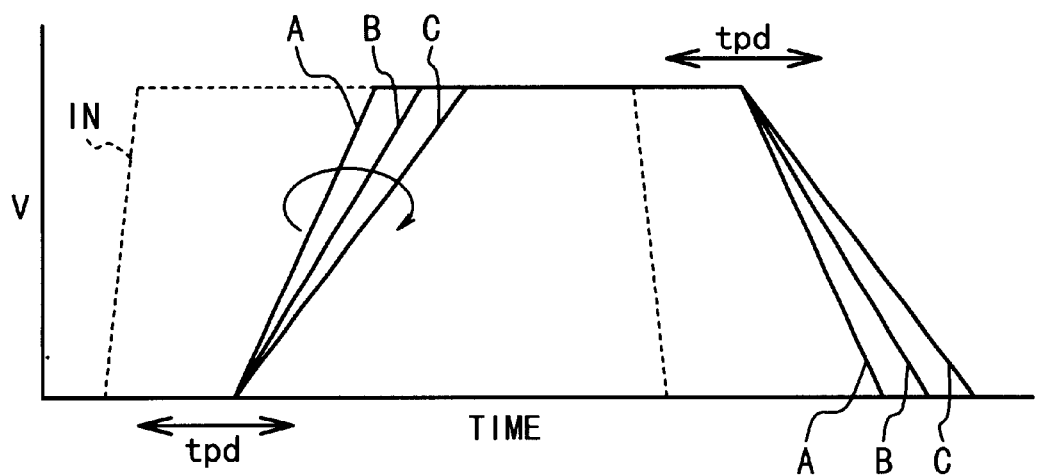
FIG. 2 is a time chart showing an example of an operation in the conventional output buffer circuit.
Figure 3:
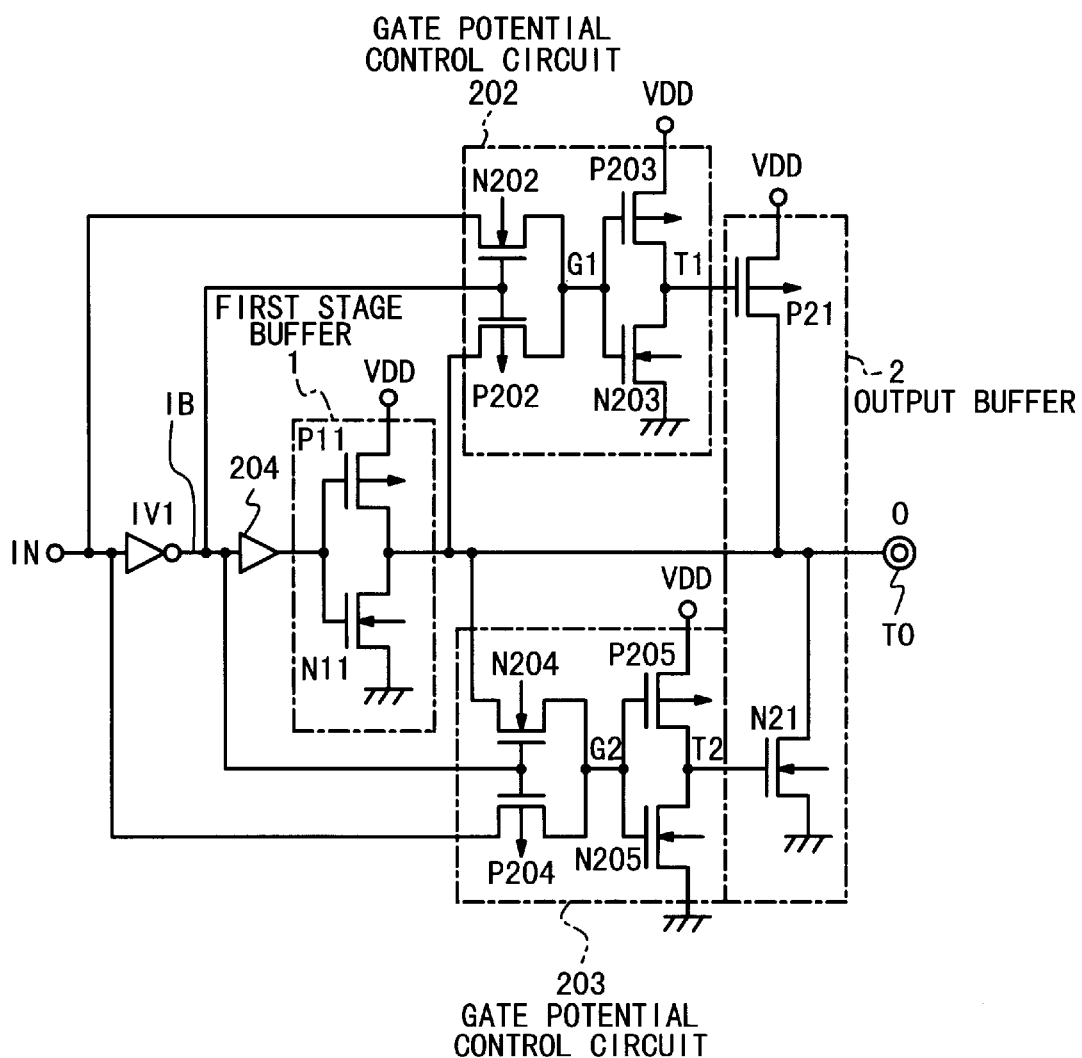
FIG. 3 is a circuit diagram showing an example of a conventional second output buffer circuit.
Figure 4:
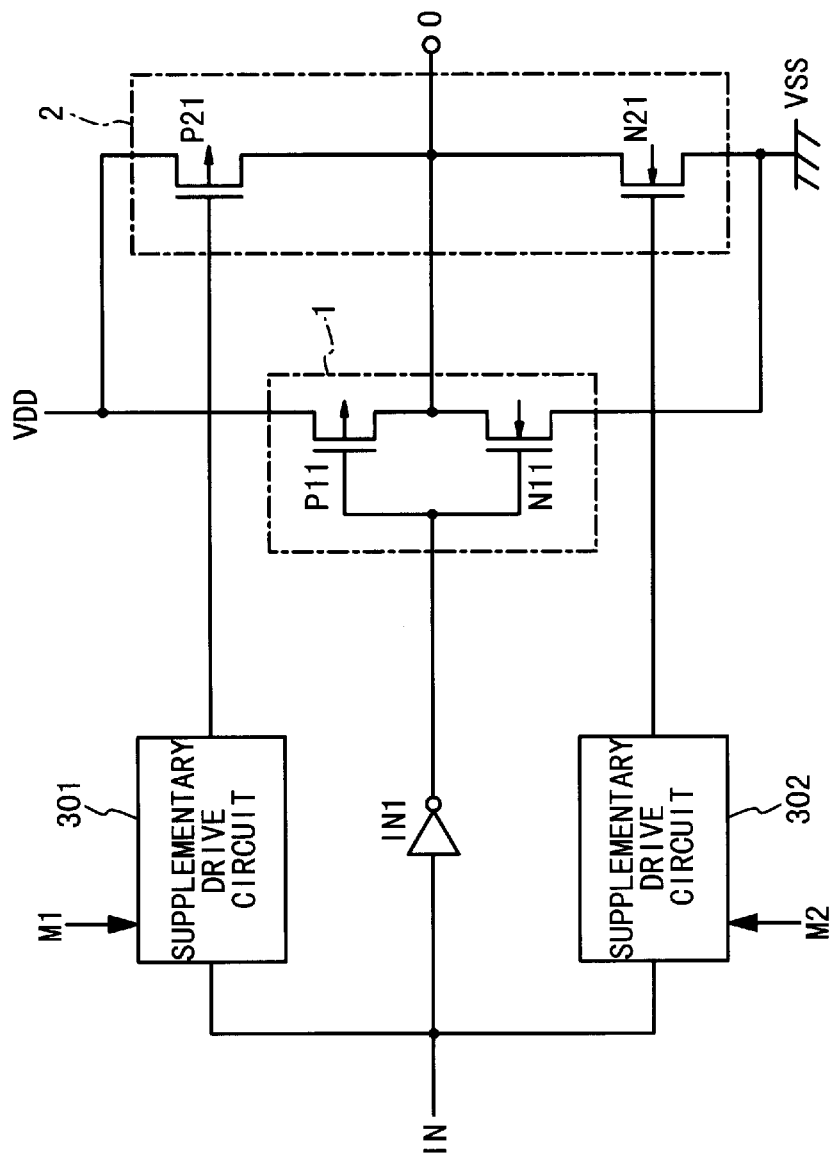
FIG. 4 is a circuit diagram showing an example of a conventional third output buffer circuit.
Figure 5:
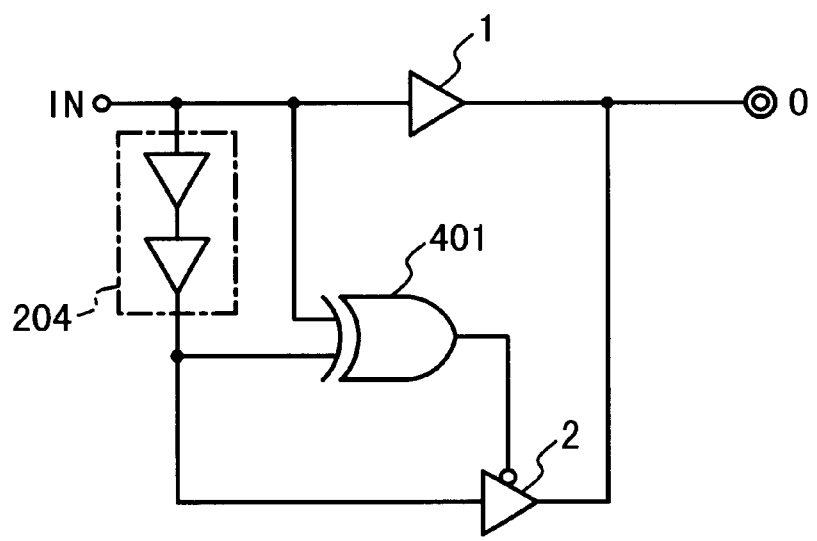
FIG. 5 a circuit diagram showing an example of a conventional fourth output buffer circuit.

The output buffer circuit in this embodiment is provided with a first stage buffer 1, an output buffer 2 and an inverter IV1 which are common to those of the conventional second output buffer circuit shown in FIG. 3.

The first stage buffer 1 is composed of a P-channel MOS transistor P11 and an N-channel MOS transistor N11. A current supply performance of the first stage buffer 1 is smaller than that of the output buffer 2. The output buffer 2 is composed of a P-channel MOS transistor P21 and an N-channel MOS transistor N21, and then outputs an output signal O to an output terminal TO in response to drive signals T1, T2. The inverter IV1 inverses an input signal IN to generate a signal IB, and then sends the signal IB to the first stage buffer 1.

The output buffer circuit in this embodiment is provided with a slew rate control circuit 3 and a resistor R1, in addition to the first stage buffer 1, the output buffer 2 and the inverter IV1.

The slew rate control circuit 3 generates the drive signals T1, T2 in which the slew rate is adjusted, in response to the input signal IN. The resistor R1 is inserted between the output terminal TO and a node S1 that is an output end of the first stage buffer 1.

In the P-channel MOS transistor P11 of the first stage buffer 1, a source thereof is connected to a power supply VDD, and a drain thereof is connected to the node S1, respectively. Then, the signal IB is inputted to a gate thereof. In the N-channel MOS transistor N11, a drain thereof is connected to the drain of the transistor P21, a source of the transistor N11 is connected to a ground G, and a gate thereof is connected to the gate of the transistor P11, respectively.

In the P-channel MOS transistor P21 that is a pull-up transistor of the output buffer 2, a source thereof is connected to the power supply VDD, a drain thereof is connected to the output terminal TO, respectively. Then, the drive signal T1 is inputted to a gate thereof. In the N-channel MOS transistor N21 that is a pull-down transistor of the output buffer 2, a drain thereof is connected to the drain of the transistor P21, and a source of the transistor N21 is connected to the ground G, respectively. Then, the drive signal T2 is inputted to a gate thereof.

Figure 7:
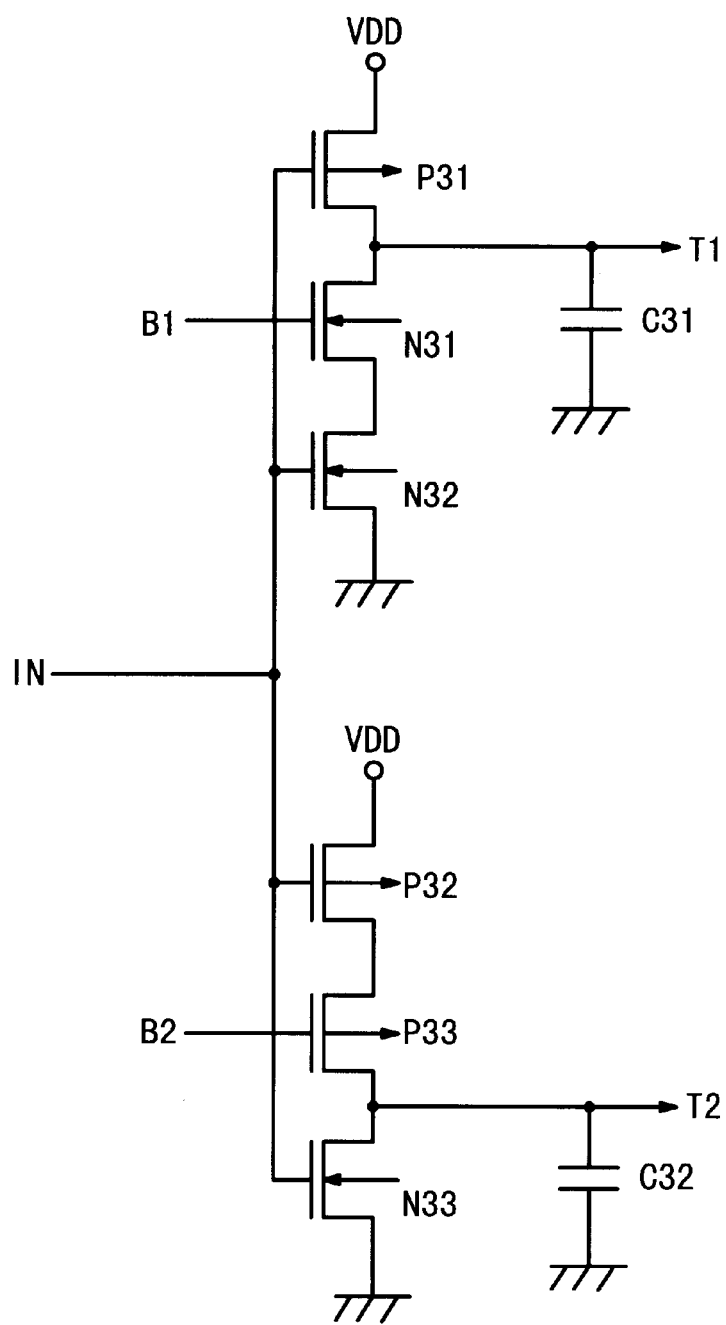
FIG. 7 is a circuit diagram showing a configuration of a slew rate control circuit of FIG. 1.

The slew rate control circuit 3 in this embodiment will be described below with reference to FIG. 7.

The slew rate control circuit 3 is provided with a P-channel MOS transistor P31, an N-channel MOS transistor N31, an N-channel MOS transistor N32, a P-channel MOS transistor P32, a P-channel MOS transistor P33, an N-channel MOS transistor N33, a capacitor C31 and a capacitor C32.

In the P-channel MOS transistor P31, a source thereof is connected to the power supply VDD. The input signal IN is inputted to a gate thereof. And, the drive signal T1 is outputted from a drain thereof. In the N-channel MOS transistor N31, a drain thereof is connected to the drain of the transistor P31, and a bias voltage B1 is inputted to a gate of the transistor N31. In the N-channel MOS transistor N32, a drain thereof is connected to a source of the transistor N31, and a source of the transistor N32 is connected to the ground G, respectively. Then, the input signal IN is inputted to a gate of the transistor N32.

In the P-channel MOS transistor P32, a source thereof is connected to the power supply VDD, and the input signal IN is inputted to a gate thereof. In the P-channel MOS transistor P33, a source thereof is connected to a drain of the transistor P32, and a bias voltage B2 is inputted to a gate of the transistor P33, and the drive signal T2 is outputted from a drain thereof. In the N-channel MOS transistor N33, a drain thereof is connected to the drain of the transistor P33, and a source of the transistor N33 is connected to the ground G, respectively. Then, the input signal IN is inputted to a gate thereof.

In the capacitor C31, one end thereof is connected to the drain of the transistor N31, and the other end of the capacitor C31 is connected to the ground G, respectively. In the capacitor C32, one end thereof is connected to the drain of the transistor N33, and the other end of the capacitor C32 is connected to the ground G, respectively.

The operations of this embodiment will be described below with reference to FIGS. 6 and 7 and FIGS. 8A to 8C.

Figure 8A:
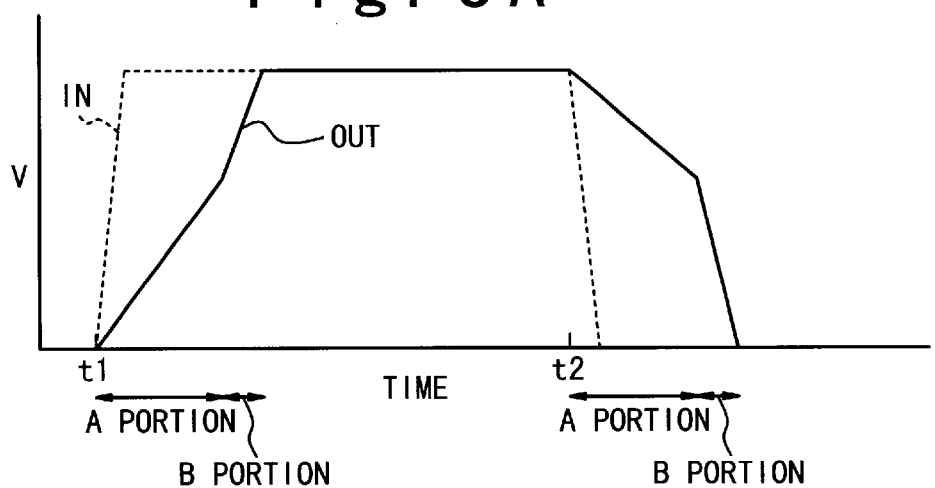
FIG. 8A is a time chart showing a relation between an input signal IN and an output signal O in the output buffer circuit of the first embodiment.

As shown in FIG. 8A, when at first, the input signal IN shown by a dashed line rises up at a time t1, the transistor P11 of the first stage buffer 1 is turned on, and the transistor N11 is turned off at the same time. Then, a potential SO at the node S1 begins to rise up. The potential SO at this node S1 is outputted through the resistor R1 to the output terminal TO, and a current begins to flow through a load.

Figure 8B:
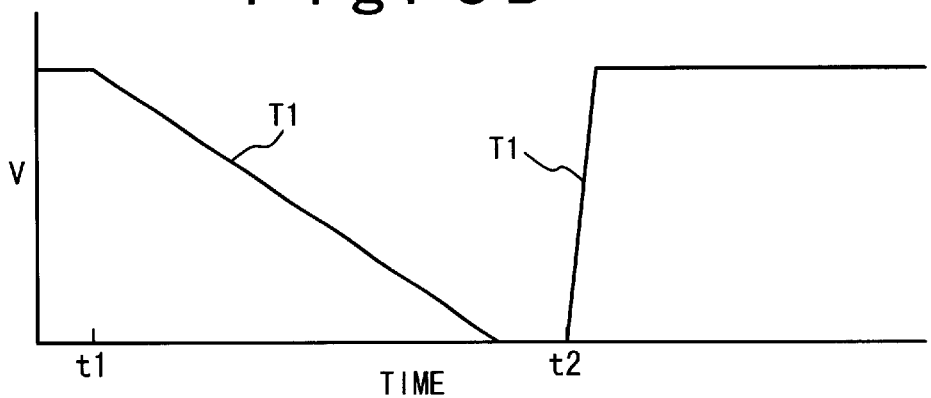
FIG. 8B is a time chart showing a drive signal T1 in the output buffer circuit of the first embodiment.
Figure 8C:
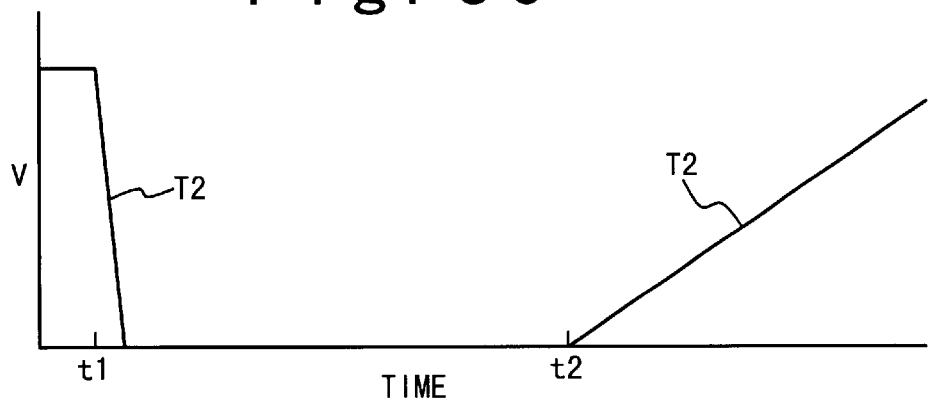
FIG. 8C is a time chart showing a drive signal T2 in the output buffer circuit of the first embodiment.

As shown in FIG. 8C, at the time t1, the drive signal T2 inputted to the gate of the transistor N21 of the output buffer 2 immediately drops since the transistor P32 of the slew rate control circuit 3 is turned off and the transistor N33 is turned on. Accordingly, the transistor N21 is turned off by the drive signal T2.

At the time t1, the transistor P31 is turned off, and the transistor N32 is turned on. Thus, as shown in FIG. 8B, the drive signal T1 gradually drops in conjunction with the constant current discharging operation of the capacitor C31 by the transistor N31 whose gate potential is controlled by the bias voltage B1. When the drive signal T1 exceeds a threshold voltage of the transistor P21, the transistor P21 is turned on, and the voltage of the output signal O begins to rise up. Accordingly, this gradually sends a current to a load capacitance CL connected to the output terminal TO, and pulls up the voltage of the output signal O to an H level.

Next, when the input signal IN drops at a time t2 as shown by the dashed line of FIG. 8A, the transistor P11 of the first stage buffer 1 is turned off, and the transistor N11 is turned on at the same time. Then, the potential SO of the node S1 begins to drop. At this node S1, the drop of the potential SO at the node S1 causes the load current to begin to be drawn through the resistor R1 from the output terminal TO.

On the other hand, the transistor P31 of the slew rate control circuit 3 is turned on, and the transistor N32 is turned off, at the time t2. Thus, the drive signal T1 inputted to the gate of the transistor P21 of the output buffer 2 instantly rises up to turn off the transistor P21, as shown in FIG. 8B.

Moreover, the transistor P32 is turned on, and the transistor N33 is turned off, at the time t2. Thus, the drive signal T2 gradually rises up in conjunction with the constant current charging operation of the capacitor C32 by the transistor P33 whose gate potential is controlled by the bias voltage B2, as shown in FIG. 8C. When the drive signal T2 exceeds the threshold voltage of the transistor N21, this transistor N21 is turned on. Accordingly, the voltage of the output signal O begins to drop, and the current is gradually drawn from the load. Hence, the voltage of the output signal O is pulled down to an L level.

As shown in FIG. 8A, in the output buffer circuit of this embodiment, the first stage buffer 1 and the resistor R1 control a former portion of a slope at the time of the shift of the output signal O indicated by a symbol OUT in FIG. 8A, namely, an A portion. A latter portion of the slope at the time of the shift of the output signal O, namely, a B portion is controlled by the drive signals T1, T2 inputted to the gates of the output buffer 2. The waveform composed of a characteristic curve corresponding to a time constant obtained by the resistor R1 and the load capacitance CL and a curve corresponding to a charging/discharging operation of the load capacitance CL by the output buffer 2 appears as the output signal O.

The performance of driving the transistor P21 and the transistor N21 of the output buffer 2 can be set to be larger to a degree. Thus, even if the slew rate of the output signal O is set to be slower or lower, it is possible to make the output current larger.

The output buffer circuit in which the dispersion is very small can be achieved by setting the on-resistance of the first stage buffer 1 to be sufficiently smaller than the value of the output resistor R1 (for example, 1/10 times or less).

Moreover, the predetermined value of the slew rate can be easily made variable without changing the output current, by setting any resistive value of the output resistor R1, setting any values of the bias voltages B1, B2 applied to the gates of the transistor N31 and the transistor P33, or setting any values of the capacitors C31, C32.

Figure 9:
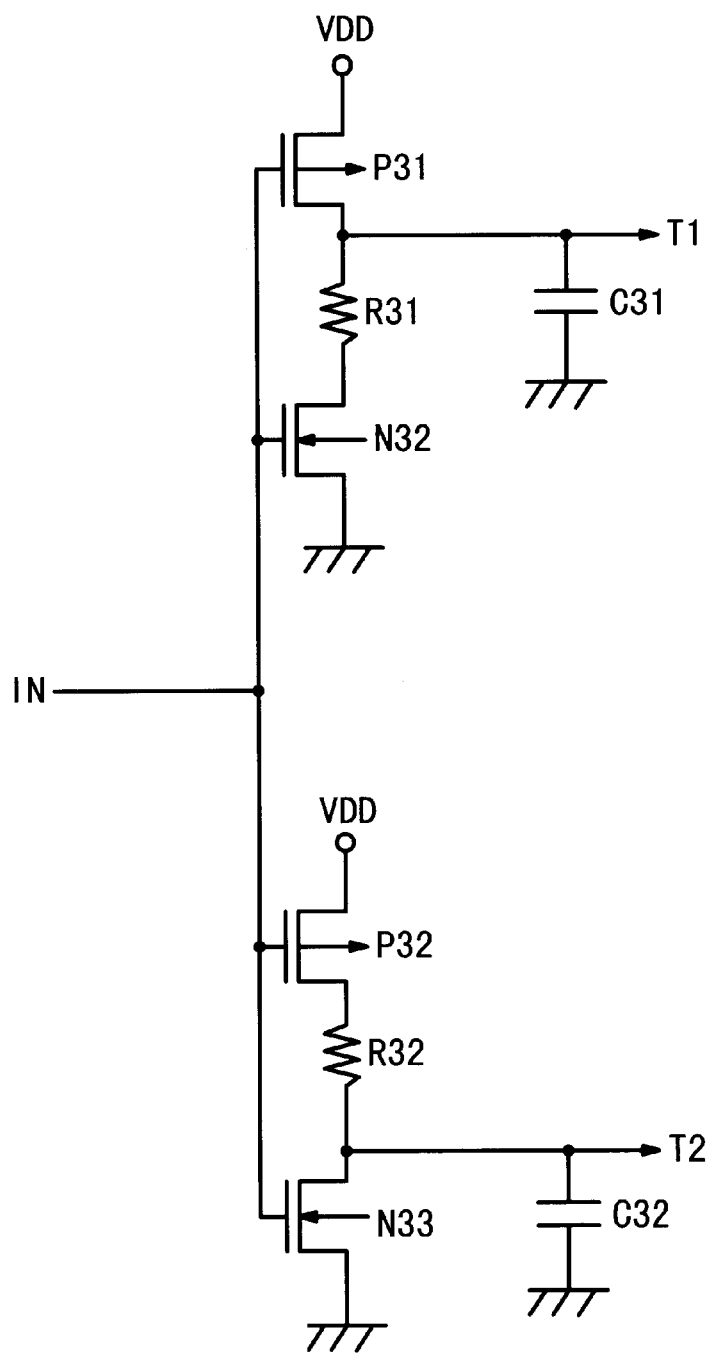
FIG. 9 is a circuit diagram showing a slew rate control circuit in a second embodiment of the output buffer circuit in the present invention.

A slew rate control circuit 3A of a second embodiment in the present invention will be described below with reference to FIG. 9. In FIG. 9, common reference characters/numerals are given to the elements common to those in FIG. 7.

The difference between the slew rate control circuit 3A and the slew rate control circuit 3 in the first embodiment is that resistors R31, R32 are respectively provided instead of the respective transistors N31, P33.

The rising up operation of the gate signal T1 corresponding to the dropping operation of the input signal IN is instantly done. The rising up performance of the gate signal T1 becomes very sharp. The dropping performance of the gate signal T1 corresponding to the rising up operation of the input signal IN depends on the discharging performance of the capacitor C31 determined by a time constant obtained by the resistor R31 and the capacitor C31.

The rising up performance of the gate signal T2 corresponding to the dropping operation of the input signal IN depends on the charging performance of the capacitor C32 determined by a time constant obtained by the resistor R32 and the capacitor C32. The dropping operation of the gate signal T2 corresponding to the rising up operation of the input signal IN is instantly done. The dropping performance of the gate signal T2 becomes very sharp.

Figure 10:
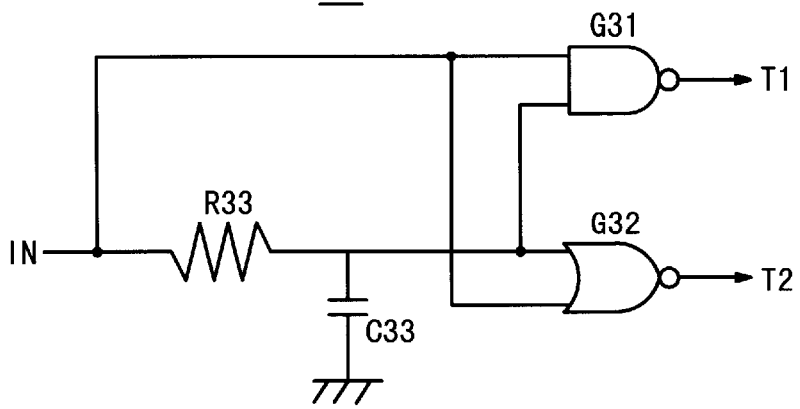
FIG. 10 is a circuit diagram showing a slew rate control circuit in a third embodiment of the output buffer circuit in the present invention.

A slew rate control circuit 3B of a third embodiment in the present invention will be described below with reference to FIG. 10.

The slew rate control circuit 3B is provided with a resistor R33, a capacitor C33, a NAND gate G31 and a NOR gate G32.

In the resistor R33, the input signal IN is sent to one end thereof. In the capacitor C33, one end thereof is connected to the other end of the resistor R33, and the other end of the capacitor C33 is connected to the ground G. In the NAND gate G31, the input signal IN is sent to one input section thereof, and the other input section thereof is connected to the other end of the resistor R33. The NAND gate G31 operates an inverted AND of the signals inputted to both the input sections, and then outputs the gate signal T1 as the operated result.

In the NOR gate G32, the input signal IN is sent to one input section thereof, and the other input section thereof is connected to the other end of the resistor R33. The NOR gate G32 operates an inverted OR of the signals inputted to both the input sections, and then outputs the gate signal T2 as the operated result.

In the slew rate control circuit 3B, a timing when the output buffer 2 is turned on is determined in accordance with a time constant obtained by the resistor R33 and the capacitor C33. That is, only the first stage buffer 1 is turned on immediately after the level of the input signal IN is shifted. At that time, the output buffer 2 is in a state of a high impedance. Thus, the output buffer 2 is turned on at the timing set in accordance with the time constant of the resistor R33 and the capacitor C33.

Figure 11:
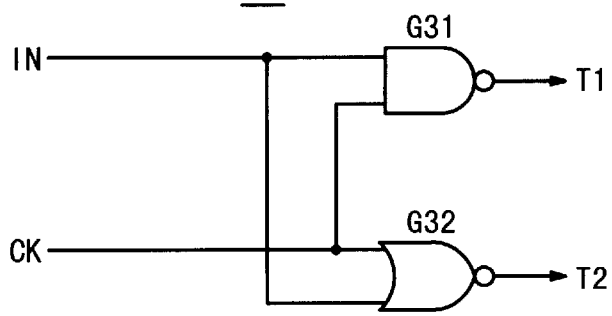
FIG. 11 is a circuit diagram showing a slew rate control circuit in a fourth embodiment of the output buffer circuit in the present invention.

A slew rate control circuit 3C of a fourth embodiment in the present invention will be described below with reference to FIG. 11. In FIG. 11, common reference characters/numerals are given to the elements common to those of FIG. 10.

The difference between the slew rate control circuit 3C and the slew rate control circuit 3B in the third embodiment is that an external clock signal CK is inputted to the NAND gate G31 and the NOR gate G32 instead of the time constant circuit composed of the resistor R33 and the capacitor C33. The gate signals T1, T2 are generated at a timing of supplying this clock signal CK. The external clock signal CK is generated from a standard clock signal obtained by using a digital counter and the like. Thus, the slew rate can be set accurately.

Figure 12:
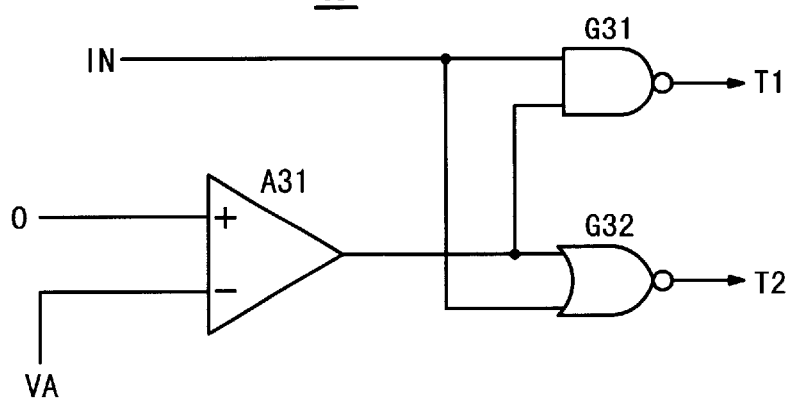
FIG. 12 is a circuit diagram showing a slew rate control circuit in a fifth embodiment of the output buffer circuit in the present invention.

A slew rate control circuit 3D of a fifth embodiment in the present invention will be described below with reference to FIG. 12. In FIG. 12, common reference characters/numerals are given to the elements common to those of FIG. 10.

The difference between the slew rate control circuit 3D and the slew rate control circuit 3B in the third embodiment is that a comparator A31 is provided instead of the time constant circuit composed of the resistor R33 and the capacitor C33. In the comparator A31, the output signal O is inputted to a non-inversion input terminal thereof, and a standard voltage VA is inputted to an inversion input terminal thereof, respectively.

When the voltage corresponding to the output signal O exceeds the standard voltage VA, the output buffer 2 is turned on. That is, the voltage of the output signal O is sensed. Accordingly, feedback is applied to the input of the output buffer 2.

As mentioned above, the output buffer circuit in the present invention is provided with the second buffer 1 at the first stage, the slew rate control circuit 3, and the first resistor R1 which is inserted between the output node and the output terminal TO and sets the output resistance of the second buffer 1. Thus, the configuration, in which the gate of the first stage buffer 1 is driven by the typical logic gate IV1 and the gate of the first buffer on the output side is driven by the slew rate control circuit 3, can reduce the dependency that the slew rate of the output signal O depends on the load capacitance and the load resistance, especially when the slew rate is slow.

The slew rate can be freely set by making the bias current or the capacitance in the slew rate control circuit 3 and the output resistor R1 variable. Moreover, as the extension effect, it is possible to make the slew rate slower to thereby provide the output buffer circuit which is not easily affected by the high harmonic noise, the ringing and the like.

The following techniques are disclosed in the present invention. In an output buffer circuit according to the present invention, the output buffer circuit inclusing a first buffer that has a first P-channel MOS transistor, in which a source thereof is connected to a first power supply and a drain thereof is connected to an output terminal, respectively, and a first N-channel MOS transistor, in which a source thereof is connected to a second power supply and a drain thereof is connected to the output terminal, respectively, wherein the continuities of the first P-channel MOS transistor and the first N-channel MOS transistor are complementarily controlled in accordance with the levels of first and second gate drive signals corresponding to the input signals to thereby control a load connected to the output terminal, further including:

a second buffer having a second P-channel MOS transistor, in which a source thereof is connected to the first power supply and a drain thereof is connected to an output node, respectively, and a gate thereof receives the buffer drive signal corresponding to the input signal, and a second N-channel MOS transistor, in which a source thereof is connected to the second power supply, a drain thereof is connected to the output node, and a gate thereof is connected to the gate of the second P-channel MOS transistor, respectively;

a slew rate control circuit that sends the respective first and second gate drive signals, in which the slew rates are respectively adjusted, to the respective gates of the first P-channel MOS transistor and the first N-channel MOS transistor, in response to the supply of the input signal; and a first resistor that is connected between the output node and the output terminal and then sets an output resistance of the second buffer.

What is claimed is:

1. An output buffer circuit comprising:

a first buffer having a first P-channel transistor and a first N-channel transistor;

a second buffer having a second P-channel transistor and a second N-channel transistor;

a slew rate control section; and a first resistor, wherein a first electrode of said first P-channel transistor is connected to a power supply, and a second electrode of said first P-channel transistor is connected to an output section, wherein a first electrode of said first N-channel transistor is connected to ground, and a second electrode of said first N-channel transistor is connected to said output section, wherein said first P-channel transistor and said first N-channel transistor complementary operates in response to first and second control resistor receptively inputted to control electrodes of said first P-channel transistor and said first N-channel transistor to output an output signal to said output section, wherein a first electrode of said second P-channel transistor is connected to said power supply, a second electrode of said second P-channel transistor is connected to an output node, and a drive signal corresponding to an input signal is inputted to a control electrode of said second P-channel transistor, wherein a first electrode of said second N-channel transistor is connected to said ground, a second electrode of said second N-channel transistor is connected to said output node, and a control electrode of said second N-channel transistor is connected to said control electrode of said second P-channel transistor, wherein said slew rate control section generates said first and second control signal from said input signal such that said first and second control signals have slew rates respectively adjusted, wherein said first resistor is connected between said output node and said output section, and thereby said first control signal and second control signal reduces a dependency on a load capacitance connected to said output section and said first resister, wherein said slew rate control section comprises:

a first control signal generating section for receiving said input signal to output said first control signal from a third node; and a second control signal generating section for receiving said input signal to output said second control signal from a fourth node, wherein said first control signal generating section comprises:

a third P-channel transistor for receiving said input signal in a control electrode of said third P-channel transistor, a first electrode of said third P-channel transistor being connected to said power supply;

a first control element for determining a change rate when said first control signal is changed, one terminal of said first control element being connected to a second electrode of said third P-channel transistor at said third node;

a third N-channel transistor, a first electrode of said third N-channel transistor being connected to said ground and a second electrode of said third N-channel transistor being connected to another terminal of said first control element; and a first capacitor, one end of said first capacitor being connected to said third node and the other end of said first capacitor being connected to said ground, and wherein said second control signal generating section comprises:

a fourth P-channel transistor for receiving said input signal in a control electrode of said fourth P-channel transistor, a first electrode of said fourth P-channel transistor being connected to said power supply;

a second control element for determining a change rate when said second control signal is changed, one terminal of said second control element being connected to a second electrode of said fourth P-channel transistor;

a fourth N-channel transistor, a first electrode of said fourth N-channel transistor being connected to said ground and a second electrode of said fourth N-channel transistor being connected to another terminal of said second control element at said fourth node; and a second capacitor, one end of said second capacitor being connected to said fourth node and the other end of said second capacitor being connected to said ground; and wherein said first control element comprises a resistor.

2. An output buffer circuit according to claim 1, wherein said second control element comprises a resistor.

3. An output buffer circuit according to claim 1, wherein said first control element comprises a resistor to determine a change rate when said first control signal is changed, based on a characteristic of charging/discharging of said first capacitor determined by a time constant obtained between said first capacitor and said first control element.

4. An output buffer circuit according to claim 1, wherein said second control element comprises a resistor to determine a change rate when said second control signal is changed, based on a characteristic of charging/discharging of said second capacitor determined by a time constant obtained between said second capacitor and said second control element.

5. An output buffer circuit comprising:
   a first buffer having a first P-channel transistor and a first N-channel transistor;
   a second buffer having a second P-channel transistor and a second N-channel transistor;
   a slew rate control section, and
   a first resistor,
   wherein a first electrode of said first P-channel transistor is connected to a power supply, and a second electrode of said first P-channel transistor is connected to an output section,
   wherein a first electrode of said first N-channel transistor is connected to ground, and a second electrode of said first N-channel transistor is connected to said output section,
   wherein said first P-channel transistor and said first N-channel transistor complementary operates in response to first and second control resistor receptively inputted to control electrodes of said first P-channel transistor and said first N-channel transistor to output an output signal to said output section,
   wherein a first electrode of said second P-channel transistor is connected to said power supply, a second electrode of said second P-channel transistor is connected to an output node, and a drive signal corresponding to an input signal is inputted to a control electrode of said second P-channel transistor,
   wherein a first electrode of said second N-channel transistor is connected to said ground, a second electrode of said second N-channel transistor is connected to said output node, and a control electrode of said second N-channel transistor is connected to said control electrode of said second P-channel transistor,
   wherein said slew rate control section generates said first and second control signal from said input signal such that said first and second control signals have slew rates respectively adjusted,
   wherein said first resistor is connected between said output node and said output section, and
   thereby said first control signal and second control signal reduces a dependency on a load capacitance connected to said output section and said first resistor, and
   wherein said slew rate control section comprises:
      third and fourth P-channel transistors;
      third and fourth N-channel transistors;
      first and second capacitors; and
      second and third resistors; and
      wherein a first electrode of said third P-channel transistor is connected to a fifth power supply, a control electrode of said third P-channel transistor receives said input signal, and a second electrode of said third P-channel transistor outputs said first control signal, and
      wherein one end of said second resistor is connected to said second electrode of said third P-channel transistor, and
      wherein a second electrode of said third N-channel transistor is connected to the other end of said second resistor, a first electrode of said third N-channel transistor is connected to a sixth power supply, and a control electrode of said third N-channel transistor receives said input signal, and wherein a first electrode of said fourth P-channel transistor is connected to a seventh power supply, and a control electrode of said fourth P-channel transistor receives said input signal, and
   wherein one end of said third resistor is connected to a second electrode of said fourth P-channel transistor, and
   wherein a second electrode of said fourth N-channel transistor is connected to the other end of said third resistor to output said second control signal, and a first electrode of said fourth N-channel transistor is connected to an eighth power supply, and a control electrode of said fourth N-channel transistor receives said input signal, and
   wherein one end of said first capacitor is connected to s aid second electrode of said third P-channel transistor, and the other end of said first capacitor is connected to a ninth power supply, and
   wherein one end of said second capacitor is connected to said second electrode of said fourth N-channel transistor, and the other end of said second capacitor is connected to a tenth power supply.

6. An output buffer circuit comprising:
   a first butter having a first P-channel transistor and a first N-channel transistor;
   a second buffer having a second P-channel transistor and a second N-channel transistor;
   a slew rate control section; and
   a first resistor,
   wherein a first electrode of said first P-channel transistor is connected to a power supply, and a second electrode of said first P-channel transistor is connected to an output section,
   wherein a first electrode of said first N-channel transistor is connected to ground, and a second electrode of said first N-channel transistor is connected to said out section,
   wherein said first P-channel transistor and said first N-channel transistor complementary operates in response to first and second control resistor receptively inputted to control electrodes of said first P-channel transistor and said first N-channel transistor to output an output signal to said output section,
   wherein a first electrode of said second P-channel transistor is connected to said power supply, a second electrode of said second P-channel transistor is connected to an output node, and a drive signal corresponding to an input signal is inputted to a control electrode of said second P-channel transistor,
   wherein a first electrode of said second N-channel transistor is connected to said ground, a second electrode of said second N-channel transistor is connected to said output node, and a control electrode of said second N-channel transistor is connected to said control electrode of said second P-channel transistor,
   wherein said slew rate control section generates said first and second control signal from said input signal such that said first and second control signals have slew rates respectively adjusted,
   wherein said first resistor is connected between said output node and said output section, and
   thereby said first control signal and second control signal reduces a dependency on a load capacitance connected to said output section and said first resistor, and
   wherein said slew rate control section comprises:

a second resistor, one end of said second resistor receiving said input signal;

a capacitor, one end of said capacitor being connected to the other end of said second resistor and the other end of said second resistor and the other end of said capacitor being connected to a fifth power supply;

a first operating section having first and second input sections, wherein said first input section receives said input signal and said second input section is connected to the other end of said second resistor, said first operating section performing a first logical operation on signals inputted respectively from said first and second input sections to output said second control signal from a result of said first logical operation; and a second operating section having first and second input sections, wherein said first input section receives said input signal and said second input section is connected to the other end of said second resistor, said second operating section performing a second logical operation on signals inputted respectively from said first and second input sections to output said first control signal from a result of said second logical operation.

7. An output buffer circuit comprising:

a first buffer having a first P-channel transistor and a first N-channel transistor;

a second buffer having a second P-channel transistor and a second N-channel transistor;

a slew rate control section; and a first resistor, wherein a first electrode of said first P-channel transistor is connected to a power supply, and a second electrode of said first P-channel transistor is connected to an output section, wherein a first electrode of said first N-channel transistor is connected to ground, and a second electrode of said first N-channel transistor is connected to said output section, wherein said first P-channel transistor and said first N-channel transistor complementary operates in response to first and second control resistor receptively inputted to control electrodes of said first P-channel transistor and said first N-channel transistor to output an output signal to said output section, wherein a first electrode of said second P-channel transistor is connected to said power supply, a second electrode of said second P-channel transistor is connected to an output node, and a drive signal corresponding to an input signal is inputted to a control electrode of said second P-channel transistor, wherein a first electrode of said second N-channel transistor is connected to said ground, a second electrode of said second N-channel transistor is connected to said output node, and a control electrode of said second N-channel transistor is connected to said control electrode of said second P-channel transistor, wherein said slew rate control section generates said first and second control signal from said input signal such that said first and second control signals have slew rates respectively adjusted, wherein said first resistor is connected between said output node and said output section, and thereby said first control signal and second control signal reduces a dependency on a load capacitance connected to said output section and said first resistor, wherein said slew rate control section comprises:

a first operating section having first and second input sections, wherein said first input section receives said input signal and said second input section receives said input signal and said second input section receives a clock signal, said first operating section performing a first logical operation on said inputted input signal and clock signal to output said first control signal from a result of said first logical operation; and a second operating section having first and second input sections, wherein said first input section receives said input signal and said second input section receives a clock signal, said second operating section performing a second logical operation on said inputted input signal and clock signal to output said second control signal from a result of said second logical operation.

8. An output buffer circuit comprising:

a first buffer having a first P-channel transistor and a first N-channel transistor;

a second buffer having a second P-channel transistor and a second N-channel transistor;

a slew rate control section; and a first resistor, wherein a first electrode of said first P-channel transistor is connected to a power supply, and a second electrode of said first P-channel transistor is connected to an output section, wherein a first electrode of said first N-channel transistor is connected to ground, and a second electrode of said first N-channel transistor is connected to said output section, wherein said first P-channel transistor and said first N-channel transistor complementary operates in response to first and second control resistor receptively inputted to control electrodes of said first P-channel transistor and said first N-channel transistor to output an output signal to said output section, wherein a first electrode of said second P-channel transistor is connected to said power supply, a second electrode of said second P-channel transistor is connected to an output node, and a drive signal corresponding to an input signal is inputted to a control electrode of said second P-channel transistor, wherein a first electrode of said second N-channel transistor is connected to said ground, a second electrode of said second N-channel transistor is connected to said output node, and a control electrode of said second N-channel transistor is connected to said control electrode of said second P-channel transistor, wherein said slew rate control section generates said first and second control signal from said input signal such that said first and second control signals have slew rates respectively adjusted, wherein said first resistor is connected between said output node and said output section, and thereby said first control signal and second control signal reduces a dependency on a load capacitance connected to said output section and said first resistor, and wherein said slew rate control section comprises:

a comparator circuit having a non-inversion input section and an inversion input section, wherein said non-inversion input section receives said output signal and said inversion input section receives a predetermined voltage signal;

a first operating section having first and second input sections, wherein said first input section receives said input signal and said second input section receives an output signal of said comparator circuit, said first operating section performing a first logical operation on said inputted input signal and output signal of said comparator circuit to output said first control signal from a result of said first logical operation; and a second operating section having first and second input sections, wherein said first input section receives said input signal and said second input section receives said output signal of said comparator circuit, said second operating section performing a second logical operation on said inputted input signal and output signal of said comparator circuit to output said second control signal from a result of said second logical operation.

* * * * *